(12) United States Patent
Su et al.

(10) Patent No.: US 6,452,461 B1
(45) Date of Patent: Sep. 17, 2002

(54) HIGH-SPEED POWER-EFFICIENT CODED M-ARY FSK MODULATOR

(75) Inventors: Ching-Hsiang Su, Taipei; Ching-Kuang Tzuang, Hsin Chu, both of (TW)

(73) Assignee: Tricome Microwave Electronics Corp. (TW)

( * ) Notice: Subject to any disclaimer, the term of this patent is extended or adjusted under 35 U.S.C. 154(b) by 0 days.

(21) Appl. No.: 09/904,305

(22) Filed: Jul. 11, 2001

(30) Foreign Application Priority Data

Oct. 2, 2000 (TW) ............................. 089120508 A

(51) Int. Cl.[7] ............................................. H03C 3/00
(52) U.S. Cl. .................. 332/100; 332/101; 332/102; 375/303; 375/307
(58) Field of Search ................ 332/100–102; 375/303, 307

(56) References Cited

U.S. PATENT DOCUMENTS 5,493,257 A * 2/1996 Chadwick ............... 332/100
5,532,654 A * 7/1996 Ieka et al. ............... 332/102

* cited by examiner

*Primary Examiner*—Terry D. Cunningham
*Assistant Examiner*—Long Nguyen
(74) *Attorney, Agent, or Firm*—Martine & Penilla, LLP

(57) ABSTRACT

A high-speed power-efficient coded M-ary Frequency-Shift Keying (M-ary FSK) modulator. The modulator includes a coding logic, which generates (M/2) Gray code signals in accordance with an (N−1) bits control signal; and (M/2) switching oscillators. Each switching oscillator includes: a composite crystal resonator with a first end and a second end; a first switch, which is controlled by Gray code signals, with one end connected to the first end of the composite crystal resonator, and the other end grounded via an equivalent negative resistance circuit; a second switch, which is controlled by serial data, with one end connected to the second end of the composite crystal resonator, and the other end grounded; and a capacitor, with one end connected to the second end of the composite crystal resonator, and the other end grounded. One of the (M/2) switching oscillators is activated by the control signal, and the frequency of the activated oscillator is switched by the serial data for achieving M-ary frequency shift.

6 Claims, 6 Drawing Sheets

(A)

(B)

(a)

(b)

(c)

(d)

HIGH-SPEED POWER-EFFICIENT CODED M-ARY FSK MODULATOR

BACKGROUND OF THE INVENTION

1. Field of the Invention

The invention relates to a frequency-shift keying (FSK) modulator, and more particularly, to a high-speed power-efficient coded M-ary Frequency-Shift Keying modulator adapted for circuit integration.

2. Description of the Related Art

Due to the rapid development of radio communication technology and the continuous improvement of semiconductor industries, radio communication technology is being used more extensively everywhere in daily life. Apart from popular cordless phones, cellular phones, pagers, and car alarms, a diversity of wireless products are spreading to people's everyday life at an unprecedented speed. The constant expansion tendency makes wireless products necessarily light in weight and small in size. However, wireless products must be made at considerably low-cost while accomplishing the following features: (1) low power consumption, (2) highly efficient transmission, (3) high reception sensitivity, and (4) high anti-interference ability. If a wireless product meets the abovementioned requirements, not only radio transmission of superior quality can be achieved, but also the lifetime of an electric cell can be prolonged as to comply with environmental protection. In view of the above, we adopt conventional M-ary FSK modulation technology to design a new type of M-ary FSK modulator, which utilizes the congenital anti-interference ability associated with FSK to attain low fabrication cost, high-speed switching frequency and high efficiency of DC-to-RF output power.

Conventional FSK technologies can be categorized into the following kinds: phase-locked loop (PLL) electronic technology, microwave electromagnetic induction technology, digital direct synthesizer (DDS), and electronically controlled resonator technology.

The fundamental principle of PLL electronic technology is described as follows. The output signal of a voltage controlled oscillator in the PLL is passed through some frequency dividing circuits, and compared with a considerably stable signal by a phase comparator. Next, the phase comparator outputs a signal that is then processed by a low-pass filter to generate a slow-changing signal, which is near DC, for controlling the frequency of the output signal of the voltage controlled oscillator. By means of the feedback operation, the voltage controlled oscillator can adjust the frequency of the output signal by setting the frequency dividing circuits. The digital type setting can be achieved by utilizing FSK frequency shifting signals generated based on input electronic codes. However, a major disadvantage of the FSK frequency shifting signals obtained by PLL is that the frequency shift rate thereof is restricted by the time constant of the filter in PLL. For example, if the channel spacing of the FSK signal is 200 KHz, in order to modulate FSK signal accurately and precisely, a typical PLL time constant approximately 0.5 ms must be used, which significantly limits the FSK frequency shift rate. In addition, a typical loop bandwidth of 16.5 KHz is typically adopted, which is much greater than the data rate of FSK. Therefore, a PLL can modulate a FSK signal accurately and precisely. However, since the data rate is comparatively slow and the channel spacing of 200 KHz cannot be efficiently used, the frequency utilization rate is quite low.

Concerning the microwave electromagnetic induction technology, it utilizes a PIN diode or a varactor to transfer impedance variation to an oscillator via electromagnetic induction by way of ON/OFF motion or capacitance changes. The oscillating conditions of the oscillator are adjusted so that the frequency changes with the signal that controls the PIN diode or the varactor. The method has an advantage that the ratio of frequency shift ($\Delta f$) to $f_0$ (that is, $\Delta f/f_0$) is very small, and the shift rate is relatively high. Nevertheless, its disadvantage is that the electromagnetic circuit cannot be easily integrated, for that the size thereof approximates the wavelength of operating frequency. Therefore, the electromagnetic circuit has a comparatively large area and need to be implemented by a hybrid microcircuit. In addition to the voltage controlled varactor, a method of controlling resonator frequency by the ON/OFF motion of a PIN diode is also commonly utilized. When the PIN diode is ON (OFF), partial inductance or capacitance in the resonator can (cannot) be connected, so as to change the output frequency of the oscillator. However, the utilization of a switching circuit in a PIN diode consumes additional DC current to attain an ON state. Besides, the fabrication process of a PIN diode is unsuitable to be introduced into the common fabrication process for ICs such as CMOS transistor, bipolar transistor, or GaAs FET at the present day.

Furthermore, a digital direct synthesizer, which utilizes digital IC, is provided with a digital accumulator operating under high-speed clocked condition, saves the output signal waveform to be generated (for example, a sine wave or phase data of any composite signals) in a ROM (Read Only Memory). Take a sine wave output as an example, a digital accumulator outputs an appropriate digital code to the input end of a digital-to-analog converter (DAC) according to a designated frequency, to generate a desired analog waveform, which is then filtered through an anti-aliasing filter. The M-ary FSK signal synthesized by a digital IC requires VLSI technology; therefore the power consumed is rather large. Since the power consumption is under restriction, such technology is disadvantageous.

Lastly, an electronically controlled resonator is an oscillator which can be illustrated by FIG. 5. The partial circuit providing signal amplification in the oscillator is represented by a negative resistance (–R). The partial circuit responsible for resonance, represented by parallel Rr-Cr-Lr circuit, represents a parallel resonator. The Rr stands for resonator loss, and larger Rr represents lower loss. Therefore, oscillation is activated only when Rr >|–R|. Altering the Lr and Cr values can change the oscillator frequency. The resonator in FIG. 5 is not restricted to be parallel type, series type resonator may also be used. For a series type resonator, the condition for activating oscillation is Rr <|–R|. A common way for directly modulating frequency employs a varactor to change the capacitance Cr and then modulate the frequency. Nevertheless, when a varactor is used to modulate a FSK signal, the frequency shift $\Delta f$ is often dramatically limited by the magnitude variation of the variable capacitance of the varator. This is because $f_0$ is inversely proportional to $\sqrt{LrCr}$, where Cr is the equivalent capacitance of the resonator. Since the resonance frequency is inversely proportional to the square root of the equivalent capacitance Cr, a comparatively large capacitance variation is required to attain a significant frequency shift and thus enable the frequency shift function of an M-ary FSK. The other disadvantage is that, for a varactor with large capacitance variation, various bias voltage (generally much higher than the bias voltage of the oscillator) is needed, which is high in cost and is not easily integrated. Besides, a varactor has a comparatively low value of Q among integrated circuits, which results in large loss. In the U.S. Pat. No. 6,078,226 entitled "Integrated Circuit Implementation of a Frequency Shift Keying Oscillator", an integrated circuit of an M-ary FSK is disclosed, as shown in FIG. 6. The circuit utilizes a power supply to switch an FSK oscillator, and employs switches to change the reactance of a SAW resonator in order to achieve high-speed switching operation. However, the circuit utilizes a single SAW resonator wherein multiple switches are used to change the reactance to attain the operation of an M-ary FSK. Since the range of frequency shift is significantly limited by the SAW resonator in the method, the frequency shift (Δf) cannot be very large, as it restricts data transmission speed.

SUMMARY OF THE INVENTION

In view of the aforesaid problems, an object of the invention is to provide a high-speed power-efficient coded M-ary FSK modulator. The high-speed power-efficient coded M-ary FSK modulator in accordance with the invention includes: a coding logic, which generates (M/2) Gray code signals in accordance with an (N−1) bits control signal; and (M/2) switching oscillators. Each switching oscillator includes: a composite crystal resonator with a first end and a second end; a first switch, which is controlled by Gray code signals, with one end connected to the first end of the composite crystal resonator, and the other end grounded via an equivalent negative resistance circuit; a second switch, which is controlled by serial data, with one end connected to the second end of the composite crystal resonator, and the other end grounded; and a capacitor, with one end connected to the second end of the composite crystal resonator, and the other end grounded.

Whereby one of the (M/2) switching oscillators is activated by a control signal, and the frequency of the activated oscillator is switched by the serial data for achieving M-ary frequency shift.

DESCRIPTION OF THE PREFERRED EMBODIMENTS

Figure 1:
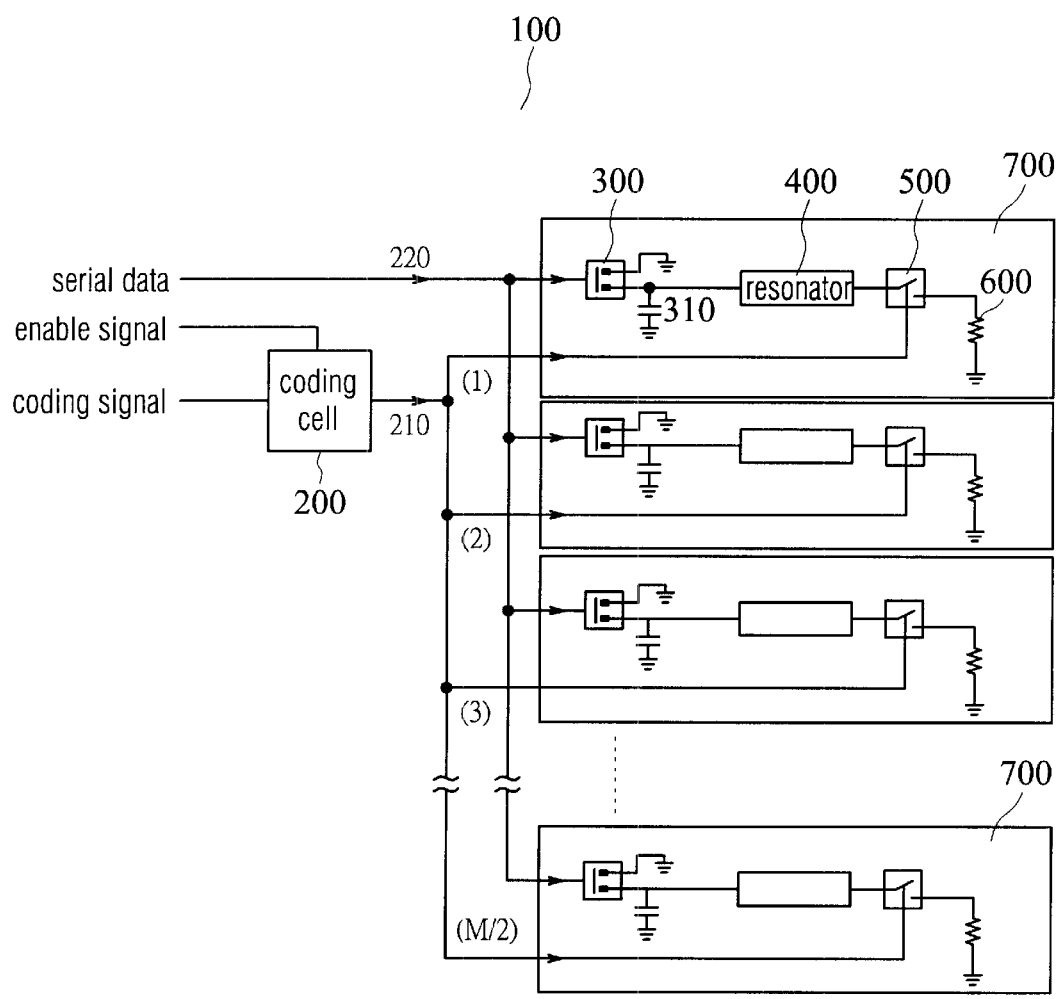
FIG. 1 is a schematic diagram showing a circuit of the high-speed power-efficient coded M-ary FSK modulator in accordance with the invention.

FIG. 1 is a schematic diagram of a high-speed power-efficient coded M-ary FSK modulator 100 in accordance with the present invention. The modulator 100 includes a coding cell 200 and (M/2) switching oscillators 700. The coding cell 200 receives (N−1) coding signals, and outputs so-called Gray code signals 210 with (M/2) bits, whereas the switching oscillators 700 receive serial data 220 and the Gray code signals 210 of the coding cell 200. In the embodiment, M represents the shift frequency of the FSK modulator 100, where $M=2^N$ and N is a positive integer.

As shown in FIG. 1, a switching oscillator 700 includes a composite crystal resonator 400, a first switch 500 for controlling the operation of the resonator 400, a second switch 300 for controlling the resonance frequency of the resonator 400, a capacitor 310 for adjusting the resonance frequency of the resonator 400, and an equivalent negative resistance circuit 600 connected to the first switch 500. The first switch 500 of each switching oscillator 700 is connected to a one-bit Gray code signal 210, which determines the ON/OFF state of the first switch 500. Since only one of the Gray code signals 210 is "1" at a time, only one switch in the (M/2) switching oscillators 700 can be activated at a time. In addition, the second switch 300 of each switching oscillator 700 is controlled by serial data 220. The serial data 220 include a series of signals "0" and "1", which determine the ON/OFF state of the second switch 300. Consequently, the series connection capacitance of the composite crystal resonator 400 varies with the ON/OFF state of the second switch 300, and the resonance frequency of the composite crystal resonator 400 varies accordingly. Since each switching oscillator 700 can provide two different resonance frequencies, the (M/2) switching oscillators 700 totally can provide M frequencies.

Apart from the serial data 220 and (N−1) coding signals, the coding cell 200 receives an enable signal as input. When the enable signal is "1" (logic high), the coding cell 200 generates Gray code signals 210 normally to control the M frequency shift signals; when the enable signal is "0" (logic low), output signals of the coding cell 200 are all set to "0", and all the switching oscillators 700 are in a dormant state. When radio transmission is not needed, the enable signal is set to "0", so that the M-ary FSK is in a rest state with no power consumption.

When a combination of 8 frequencies is desired, M must be set to be 8, and at the time N−1=2. The coding cell 200 has two input control signals, and four combinations that control four switching oscillators 700. Due to the property of the output Gray code signals 210, only one oscillator 700 is activated at a time, and the rest are in an OFF state. Each switching oscillator receives two frequencies generated by serial data 220, and thus there are eight frequency combinations.

Figure 2:
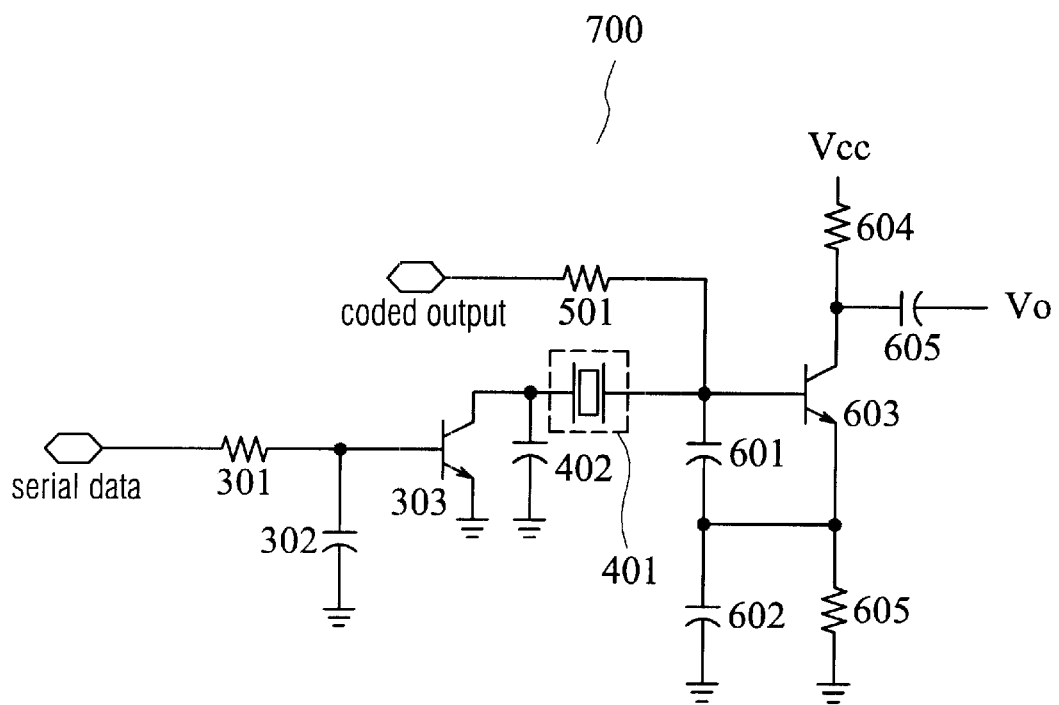
FIG. 2 is circuit diagram showing an example of the switching oscillator in FIG. 1.

The oscillator 700 as shown in FIG. 1 can be implemented by hybrid or monolithic IC fabrication process of complementary metal oxide semiconductor (CMOS) and bipolar transistor. FIG. 2 is a circuit diagram showing a preferred embodiment of the switching oscillator 700. The oscillator 700 utilizes only two transistors to attain signal switching and oscillator switching with utmost low power loss.

Referring to FIG. 2, the transistor 303 of the oscillator 700 functions as the switch 300 in FIG. 1. In FIG. 2, the transistor 303 is shown as a bipolar transistor, which can be replaced by an NMOS transistor. When the serial data 220 are "0" (ground or lower than the threshold voltage of the transistor 303), the transistor 303 cannot be forward biased, relatively high impedance thus exists between the collector and the emitter (the drain and the source for NMOS transistor) of the transistor 303, that is, open state. Hence one end of the composite crystal resonator 401 is grounded via a series-connection capacitor 402, forming a first resonance frequency.

When the serial data 220 is "1" (normally, 3V), the signal 220 is connected to the base of the transistor 303 (or the gate of NMOS), via a low-pass filter formed by the resistor 301 and the capacitor 302, such that the path between the collector and the emitter of the transistor 303 (the drain and the source of the NMOS) is turned on. In addition, the composite resonator 401 is made of quartz crystal, which does not allow DC current to pass, only small AC current is allowed to pass. As a result, a very small base current can make the transistor 303 enter the saturation region. If the transistor 303 is an NMOS transistor, the high voltage of logic "1", which is larger than Vth, is enough to make the NMOS enter the ON state. The transistor 303 at the moment almost consumes no power to enter the ON state, and the resistance between the collector and the emitter (the drain and the source for an NMOS) is only 2~3 Ω or less. Therefore, nearly short-circuited impedance is observed on the left end of the composite crystal resonator 401, and the capacitor 402 is short-circuited. Thus one end of the composite crystal resonator 401 is grounded directly, forming a second resonance frequency.

In other words, a colpitz oscillator formed by the composite crystal resonator 401 and the transistor 603, the capacitors 601 and 602, and the resistors 604, 605 and 501, determines the two different frequencies of the oscillator according to the value of the serial data. The aforesaid two frequencies consist of a first resonance frequency formed by the composite crystal resonator 401 and the series-connection capacitor 402, and a second resonance frequency defined by the composite crystal resonator 401.

Furthermore, the transistor 603 of FIG. 2 is used not only as an oscillator, but also as a switch. When the Gray code signal 210 of the coding cell 200, which is connected to the left end of the resistor 501, is logic "1", normally around 3V, the transistor 603 receives a bias voltage, and the bias point thereof is determined by the resistors 501 and 605. At the time, the transistor 603 operates as an oscillator and outputs an oscillation signal via the resistor 605. If the Gray code signal 210 is "0", forward bias is absent between the base and the emitter of the transistor 603. Therefore, the transistor 603 is OFF, a very high impedance exists between the collector and the emitter of the transistor 603, which approximates the open state of a switching circuit. The oscillator is unable to operate under such circumstances, and enters an idle state with almost no power consumption. The transistor 603 being ON or OFF is merely controlled by a very small base current of the transistor 603 flowing via the resistor 501. Hence the switching operation is quite fast.

Figure 3:
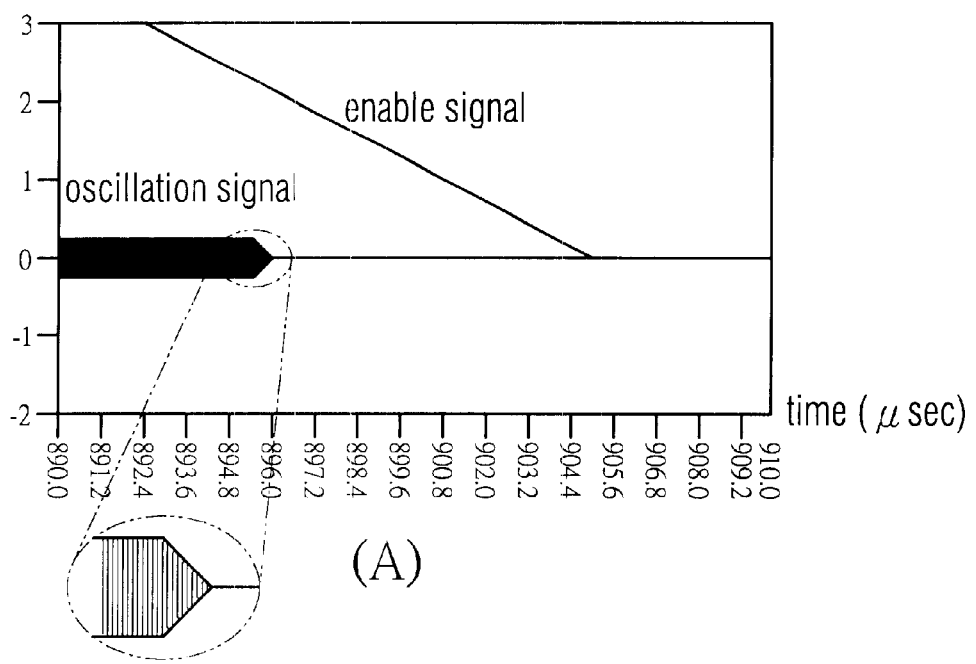
FIG. 3 is a diagram showing relationship between the enable signal and the oscillation signal.
Figure 3:
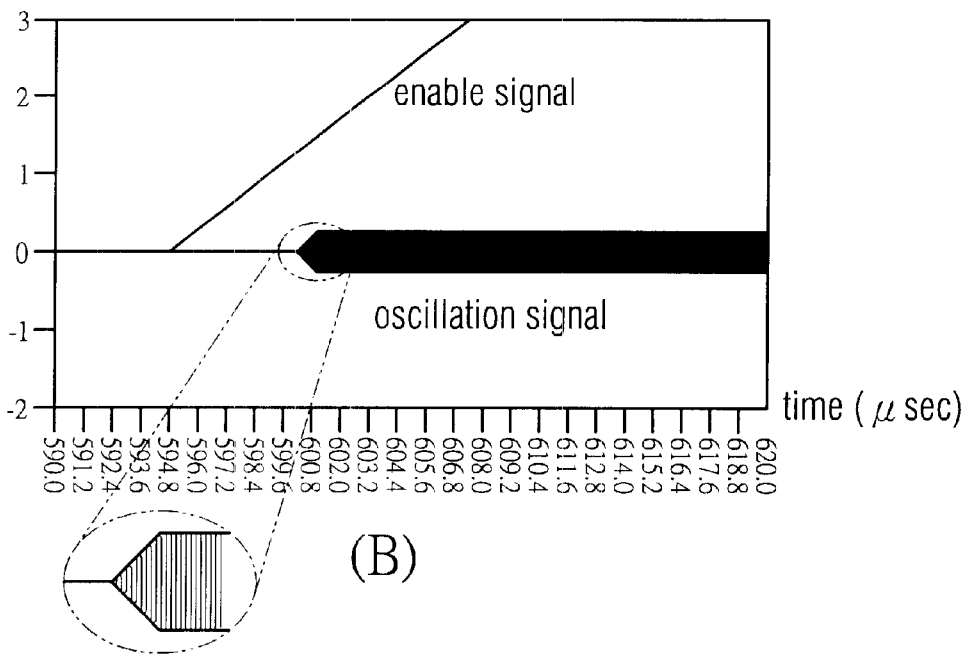

By adopting an accurate model of Agilent ADS software and the NPN_2N2222A database thereof, a precise simulation technology can be performed. FIG. 3 shows that when the enable signal varies between 0 and 3V, and both the ascending time and the descending time thereof are approximately 10 μsec, the serial data 200 are 5 kbps. For the oscillator formed by the transistor 603 of FIG. 2, the simulation data of the ON and OFF time for oscillation is approximately 5 μsec, which is smaller than the ascending and descending time of digital signal. Therefore, the ON and OFF time for the oscillator is determined by the ascending and descending time of the enable signal. The time period thereof is much shorter than that of a PLL circuit.

Figure 4:
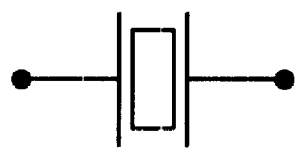
FIG. 4 shows several typical designs of a composite crystal resonator.
Figure 4:
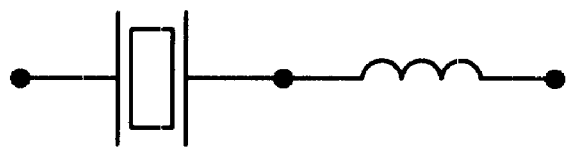
Figure 4:
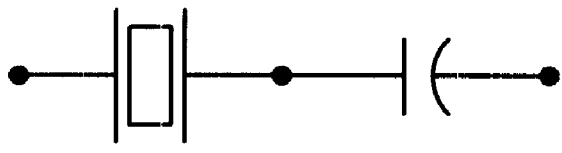
Figure 4:
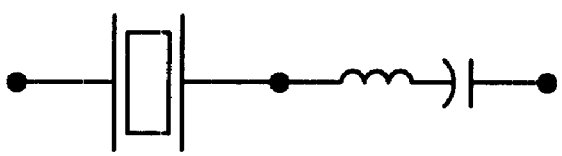
Figure 5:
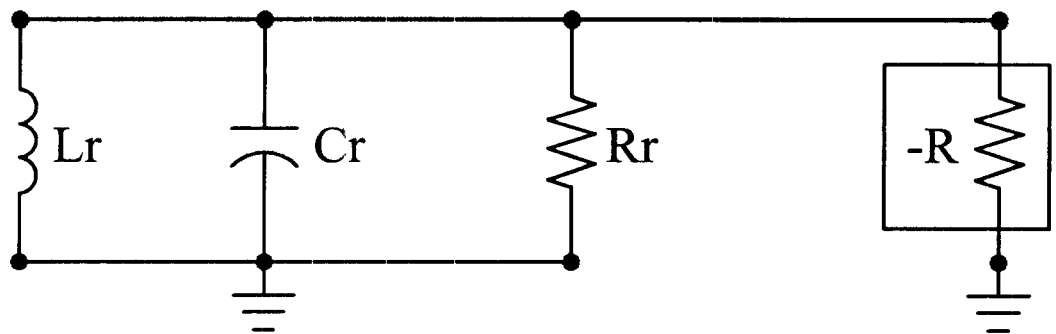
FIG. 5 shows a simplified circuit of a conventional oscillator.
Figure 6:
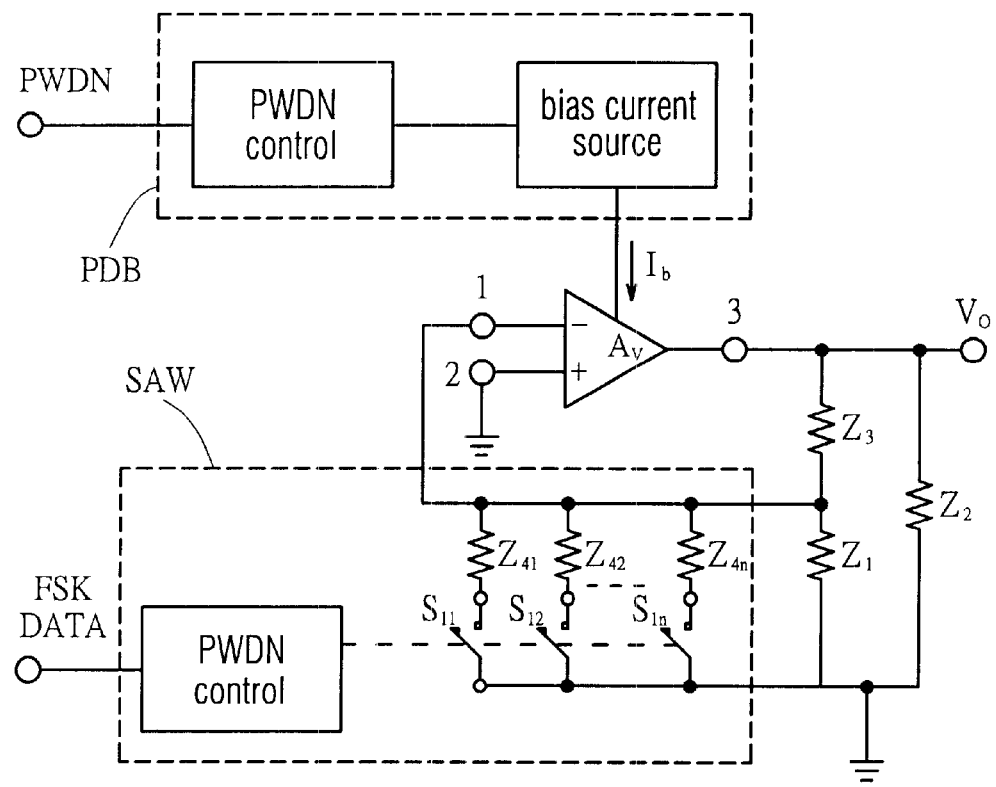
FIG. 6 shows an example of an integrated circuit implementation of a conventional M-ary FSK oscillator.

Referring to FIG. 4, which shows several typical designs of the composite crystal resonator 401 of FIG. 2. The composite crystal resonator 401 is based on a crystal resonator (FIG. 4a), and can be connected in series to a single inductor (FIG. 4b), or a single capacitor (FIG. 4c), or an inductor and a capacitor (FIG. 4d), to change the modulation degree of an FSK signal.

Therefore, the invention provides a design of an M-ary FSK modulator with high efficiency and high data rate. The innovated design provides a transistor which operates as an oscillator and performs high-speed switching simultaneously, and places the switching oscillator in a coding circuit structure to form an M-ary FSK modulator constituted entirely by transistors, which is adapted for circuit integration. The coding circuit (encoder) can be Gray code signals encoder, using the characteristics of Gray code signals which change only one bit at a time, to activate merely an externally connected composite crystal oscillator at a high speed each time. The design is especially applicable for digital radio transmission system with a particular demand of power efficiency, for example, satellite communication or high-efficiency radio communication equipment.

The preferred embodiments above are to illustrate the structure of high-speed power-efficient coded M-ary FSK modulator of the present invention, but are not to be construed as limiting the invention. It is therefore contemplated that the appended claims will embrace any alternatives, modifications and variations as falling within the true scope and spirit of the present invention.

What is claimed is:

1. A high-speed power-efficient coded M-ary FSK modulator comprising:
    a coding logic, which generates (M/2) Gray code signals in accordance with an (N−1) bits control signal, where $M=2^N$, and
    (M/2) switching oscillators each comprising:
        a composite crystal resonator with a first end and a second end;
        a first switch, which is controlled by the Gray code signals, with one end connected to the first end of said composite crystal resonator, and the other end grounded via an equivalent negative resistance circuit;
        a second switch, which is controlled by serial data, with one end connected to the second end of said composite crystal resonator, and the other end grounded; and
        a capacitor, with one end connected to the second end of said composite crystal resonator, and the other end grounded;
    whereby one of said (M/2) switching oscillators is activated by the control signal, and the frequency of the activated oscillator is switched by said serial data for achieving M-ary frequency shift.

2. The high-speed power-efficient coded M-ary FSK modulator of claim 1, wherein said coding logic receives an enable signal, said coding logic outputs logic "0" when the enable signal does not activate.

3. The high-speed power-efficient coded M-ary FSK modulator of claim 1, wherein said switching oscillator outputs oscillation signals via said first switch.

4. The high-speed power-efficient coded M-ary FSK modulator of claim 1, wherein said composite crystal resonator is quartz crystal connected with a capacitor.

5. The high-speed power-efficient coded M-ary FSK modulator of claim 1, wherein said composite crystal resonator is quartz crystal connected with an inductor.

6. The high-speed power-efficient coded M-ary FSK modulator of claim 1, wherein said composite crystal resonator is quartz crystal connected with a capacitor and an inductor.

* * * * *